United States Patent
Yang et al.

(10) Patent No.: US 7,573,310 B2
(45) Date of Patent: Aug. 11, 2009

(54) SET/RESET LATCH CIRCUIT, SCHMITT TRIGGER CIRCUIT, AND MOBILE BASED D-TYPE FLIP FLOP CIRCUIT AND FREQUENCY DIVIDER CIRCUIT THEREOF

(75) Inventors: Kyoung-Hoon Yang, Daejeon (KR); Tae-Ho Kim, Daejeon (KR); Yongsik Jeong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 5 days.

(21) Appl. No.: 11/418,207

(22) Filed: May 5, 2006

(65) Prior Publication Data

US 2007/0069810 A1    Mar. 29, 2007

(30) Foreign Application Priority Data

Sep. 23, 2005    (KR) ............... 10-2005-0088554

(51) Int. Cl.
  *H03K 3/315* (2006.01)
(52) U.S. Cl. ............ 327/195; 327/217; 327/218; 327/220; 327/570; 326/134; 326/135; 377/128
(58) Field of Classification Search ......... 327/195–197, 327/217, 218, 568, 570, 22, 220; 326/134, 326/135; 377/128
See application file for complete search history.

(56) References Cited

U.S. PATENT DOCUMENTS

| | | | | |
|---|---|---|---|---|
| 3,253,165 A | * | 5/1966 | Cornish | 326/132 |
| 3,254,238 A | * | 5/1966 | Cooperman | 326/132 |
| 3,622,805 A | * | 11/1971 | McMorrow, Jr. | 327/499 |
| 5,313,117 A | | 5/1994 | Maezawa | 326/134 |
| 5,543,748 A | * | 8/1996 | Ando | 327/570 |
| 6,323,708 B1 | * | 11/2001 | Uemura | 327/195 |
| 6,323,709 B1 | * | 11/2001 | Kulkarni et al. | 327/195 |
| 7,015,724 B2 | * | 3/2006 | Godin | 326/134 |
| 7,098,438 B1 | * | 8/2006 | Frazier | 250/214 R |
| 7,202,708 B2 | * | 4/2007 | Luh et al. | 327/77 |
| 2006/0132168 A1 | * | 6/2006 | Yang et al. | 326/6 |

FOREIGN PATENT DOCUMENTS

JP    9162705    6/1997

OTHER PUBLICATIONS

Chen et al., "Monolithic Integration of Resonant Tunneling Diode and FET's for Monostable—Bistable Transition Logic Elements (MOBILE's)," IEEE Electron Device Letters, vol. 16, No. 2, Feb. 1995, pp. 70-73.

(Continued)

*Primary Examiner*—Lincoln Donovan
*Assistant Examiner*—Patrick O'Neill
(74) *Attorney, Agent, or Firm*—Greenblum & Bernstein, P.L.C.

(57) ABSTRACT

The present invention relates to a SET/RESET latch circuit a Schmitt trigger circuit, and a MOBILE based D-type flip flop circuit and frequency divider circuit using the SET/RESET latch circuit and Schmitt trigger circuit. The SET/RESET latch circuit is configured with CML-type transistors and negative differential resistance diodes. The SET/RESET latch circuit can be applied to very high speed digital circuits.

11 Claims, 18 Drawing Sheets

OTHER PUBLICATIONS

English language abstract of JP 9-162705, Jun. 20, 1997.
Maezawa et al., "A Novel Delayed Flip-Flop Circuit Using Resonant Tunneling Logic Gates," Japanese Journal of Applied Physics, vol. 37, No. 2B, Feb. 1998, pp. L212-L213.
Kim et al., "New RTD-based set/reset latch IC for high-speed mobile D-flip flops," 2005 International Conference on Indium Phosphide and Related Materials, May 2005, pp. 311-314.

* cited by examiner

Connection of N - 2 : 1 frequency divider

US 7,573,310 B2

SET/RESET LATCH CIRCUIT, SCHMITT TRIGGER CIRCUIT, AND MOBILE BASED D-TYPE FLIP FLOP CIRCUIT AND FREQUENCY DIVIDER CIRCUIT THEREOF

TECHNICAL FIELD

The present invention relates to SET/RESET latch circuit, Schmitt trigger circuit, and MOBILE (MOnostable-BIstable transition Logic Element) based D-type flip flop circuit and frequency divider circuit using the SET/RESET latch circuit and Schmitt trigger circuit.

With a view to increasing the operating speed and being applicable to very high speed circuits, a SET/RESET latch circuit using CML(Current Mode Logic)-type 3-port transistors and negative differential resistance diodes, and its application circuits are presented.

Operating speed of SET/RESET latch circuit is improved by using CML-type transistors, and the SET/RESET latch circuit also provides differential outputs so that it can be easily used for conventional very high-speed digital circuits such as ECL(Emitter-Coupled Logic) and SCFL(Source Coupled FET Logic). A Schmitt trigger circuit with threshold voltages $V_{TH}$ and $V_{TL}$ is implemented by using SET port and RESET port of SET/RESET latch as $V_{IN}$ and $V_{REF}$, respectively. Compared to the conventional ECL- or SCFL-type D-type flip flop circuit, NRZ mode D-type flip flop circuit requires small number of components. Since NRZ mode. D-type flip flop circuit does not require feedback loop, it can achieve highly efficient low-power characteristics as well as very high operating speed. A 2:1 static frequency divider can be implemented by feeding the output of NRZ mode D-type flip flop circuit(proposed in the present invention) back to the input port(i.e., feedback output to input).

BACKGROUND ART

The present invention relates to SET/RESET latch circuit, Schmitt trigger circuit, and MOBILE based D-type flip flop circuit and frequency divider circuit using said SET/RESET latch circuit and Schmitt trigger circuit, in which said SET/RESET latch circuit uses CML(Current Mode Logic)-type 3-port transistors and negative differential resistance diodes.

The DC I-V characteristics of negative differential resistance diode used in the present invention is shown in FIG. 3. A representative example for implementing D-type flip flop circuit by using the diode with negative differential resistance characteristics is MOnostable-BIstable transition Logic Element(MOBILE), where in MOBILE, two negative differential resistance diodes(Resonant Tunneling Diode) are connected in serial as shown in FIG. 1, and a transistor is connected to a negative differential resistance diode in parallel as shown in a US patent(U.S. Pat. No. 5,313,117, Semiconductor logic circuit using two N-type negative resistance devices) and a paper(Monolithic integration of resonant tunneling diode and FET's for Monostable-BIstable transition Logic Elements, IEEE Electron Device Letters, vol. 16, no. 2 Feb. 1995).

However, in the above circuits, the output signal is provided as a Return-to-Zero(RZ)-mode signal. In fact, since Non-Return-to-Zero(NRZ)-mode signal system is utilized for increasing operation speed of system in very high speed optical communication system, it has difficulties in applying RZ-mode MOBILE circuit to very high speed digital circuits. In order to overcome the above disadvantages, a D-type flip flop circuit with NRZ-mode output signal using two MOBILE circuits with RZ-mode output and SET/RESET latch circuit have been reported in a Japan patent(1997-162705, a flip-flip circuit) and a paper(A novel Delayed Flip-Flop circuit using resonant tunneling logic gates, Jpn. J. Appl. Phys., vol. 37, no. 2B, February 1998). Therein, NRZ-mode D-type flip flop circuit is implemented by connecting SET/RESET latch circuit to the MOBILE circuit output stage with RZ-mode output signal.

DISCLOSURE

[Technical Problem]

In SET/RESET latch circuit, transistors(122, 123) are respectively connected to the serially connected two RTD (120, 121) in parallel as shown in FIG. 2. When RZ-type SET and RESET signals are applied to this SET/RESET latch circuit, the voltage levels of SET and RESET are different because of the serial connection between transistors of SET/RESET latch circuit. Thereby additional circuit like a level shifter is required in case of supplying voltage to transistors. Moreover, since transistors 122 and 123 operate in saturation regime in process of operating SET/RESET latch circuit, there is a point at issue for decreasing the operating speed of the circuit. There is an additional point at issue for generally applying it to the differential type circuit used in existing very high speed circuits because of a single output port.

[Technical Solution]

The present invention is directed to improve the operating speed of the circuit and compatibility with the conventional very high speed circuits such as ECL or SCFL.

The followings are objectives of the present invention.

The operating speed can be increased by identically supplying the voltage level of SET and RESET signals to the SET/RESET latch circuit, and by operating transistors of SET/RESET latch circuit in active regime.

Moreover, provided differential outputs to NRZ mode D-type flip flop circuit, it can be insured that NRZ-mode D-type flip flop circuit is compatible with the conventional very high-speed digital circuits with ECL and SCFL interface. Thereby, NRZ-mode D-type flip flop circuit with differential outputs cab be used for a core block of very high speed digital circuits. A static frequency divider can also be implemented by supplying the output of D-type flip flop circuit as its input in feedback.

SET/RESET latch circuit can be used as a Schmitt trigger circuit which is applicable to the comparator that is a core circuit of ADC(Analog-to-Digital Converter) by configuring SET to $V_{IN}$ and RESET to $V_{REF}$.

[Advantageous Effects]

As described in the above, SET/RESET latch circuit, Schmitt trigger circuit, MOBILE based D-type flip flop circuit and frequency divider circuit using SET/RESET latch circuit and Schmitt trigger circuit in accordance with the present invention have the following advantageous effects.

1) Operating speed of SET/RESET latch circuit is improved by using CML-type transistors, and the SET/RESET latch circuit also provides differential outputs so that it can be easily used for the conventional very high-speed digital circuits.

2) A Schmitt trigger circuit with threshold voltages $V_{TH}$ and $V_{TL}$ is implemented by using SET port and RESET port of SET/RESET latch as $V_{IN}$ and $V_{REF}$, respectively.

3) Moreover, compared to the conventional SCFL or ECL-type D-type flip flop circuit, NRZ-mode D-type flip flop circuit in the present invention requires a small number of devices. Since feedback loop is not required, NRZ mode D-type flip flop circuit with highly efficient low-power characteristic as well as very high operating speed can be implemented.

4) Moreover, a 2:1 static frequency divider can be implemented by feeding the output of NRZ mode D-type flip flop circuit (proposed in the present invention) back to the input port (i.e., feedback output to input).

DESCRIPTION OF DRAWINGS

FIG. 25b is timing diagrams illustrating the operations of 2:1 static frequency divider depicted in FIG. 25a.

DESCRIPTION OF THE NUMERALS ON THE MAIN PARTS OF THE DRAWINGS

Figure 1:
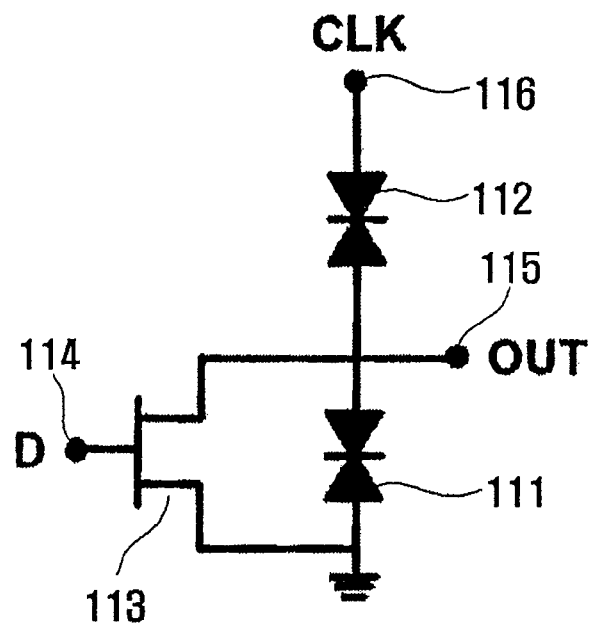
FIG. 1 is a MOBILE circuit using negative differential resistance diode in accordance with prior arts.

All 3-port transistors including FET and BJT are commonly described by the name of a "transistor" through the description of the present invention.

111, 117: negative differential resistance diodes configuring the driver part of MOBILE circuit in accordance with prior arts 112, 118: negative differential resistance diodes configuring the load part of MOBILE circuit in accordance with prior arts 113, 119: transistors configuring the driver part of MOBILE circuit in accordance with prior arts 114: input port of MOBILE circuit in accordance with prior arts 115: output port of MOBILE circuit in accordance with prior arts 116: clock port of MOBILE circuit in accordance with prior arts 120, 121: negative differential resistance diodes configuring SET/RESET latch circuit in accordance with prior arts 122, 123: transistors configuring SET/RESET latch circuit in accordance with prior arts 124: output port of SET/RESET latch circuit in accordance with prior arts 125: bias port of SET/RESET latch circuit in accordance with prior arts 211, 212: negative differential resistance diodes used for SET/RESET latch circuit 213, 214: transistors used for SET/RESET latch circuit 215: SET input port of SET/RESET latch circuit 216: RESET input port of SET/RESET latch circuit 217: inverted output port of SET/RESET latch circuit 218: output port of SET/RESET latch circuit 219: current source of SET/RESET latch circuit 220: bias port of SET/RESET latch circuit 221, 223: DC I-V characteristics of negative differential resistance diode 222, 224: DC I-V characteristics of 3-port transistor 225, 226: junction diode or Schottky diode 227: DC I-V characteristics of junction diode or Schottky diode 228: DC I-V characteristics of parallel connected negative differential resistance diode and junction diode (or Schottky diode)

229: input($V_{IN}$) port of Schmitt trigger circuit

230: reference($V_{REF}$) port of Schmitt trigger circuit 231, 232: emitter degeneration resistors 311, 312: load negative differential resistance diode of CML-type MOBILE circuit with differential outputs 313, 314: driver negative differential resistance diode of CML-type MOBILE circuit with complementary outputs 315, 316: transistors of CML-type MOBILE circuit with complementary outputs 317: input port of CML-type MOBILE circuit with complementary outputs 318: reference port of CML-type MOBILE circuit with complementary outputs 319: clock port of CML-type MOBILE circuit with complementary outputs 320: bias port of CML-type MOBILE circuit with complementary outputs 321: current source of CML-type MOBILE circuit with complementary outputs 322: inverted input port of CML-type MOBILE circuit with complementary outputs 411, 412: transistors of CML-type common-emitter output buffer 413, 414: resistors of CML-type common-emitter output buffer 415: inverted output port of CML-type output buffer 416: output port of CML-type output buffer 417: current source of CML-type output buffer 418, 419: transistors of emitter-follower output buffer 420, 421: resistors of emitter-follower output buffer 422: inverted output port of emitter-follower output buffer 423: output port of CML-type output buffer

[Mode for Invention]

The invention is directed to present SET/RESET latch circuit, which is characterized by including a transistor 1 and 2 in which each emitter of said transistors is commonly connected to a current source, and a negative differential resistance diode which is connected to a collector of only one transistor of said transistor 1 and 2; and additionally performing to be the relationship of $I_P < I_{EE} < 2 \cdot I_P$ (where, $I_P$: the peak current of a negative differential resistance diode, $I_{EE}$: the current of the current source connected in serial to the common node of emitters of a transistor 1 and 2); and thereby providing a single Non-Return-to-Zero mode output in case that Return-to-Zero mode SET and RESET voltages are respectively supplied on is the base ports of said transistor 1 and 2.

Likewise, the invention is directed to present SET/RESET latch circuit, which is characterized by including a transistor 1 and 2 in which each emitter of said transistors is commonly connected to a current source, and a negative differential resistance diode 1 and 2 which are respectively connected to each collector of said transistor 1 and 2; and additionally performing to be the relationship of $I_P < I_{EE} < 2 \cdot I_P$ (where, $I_P$: the peak current of a negative differential resistance diode 1 and 2, $I_{EE}$: the current of the current source connected in serial to the common node of emitters of a transistor 1 and 2); and thereby providing differential Non-Return-to-Zero mode outputs in case that Return-to-Zero mode SET and RESET voltages are respectively supplied on the base ports of said transistor 1 and 2.

Moreover, the invention is directed to present Schmitt trigger circuit, which is characterized by including a transistor 1 and 2 in which each emitter of said transistors is commonly connected to a current source, and a negative differential resistance diode which is connected to a collector of only one transistor of said transistor 1 and 2; and additionally performing to be the relationship of $$V_{TH} = \eta V_T \ln\left(\frac{I_{EE}}{I_V} - 1\right) + V_{REF}$$

$$V_{TL} = \eta V_T \ln\left(\frac{I_{EE}}{I_P} - 1\right) + V_{REF}$$

(where,: $V_{TH}$, $V_{TL}$: threshold voltages of Schmitt trigger circuit, $\eta$: ideality factor of transistor 1 and 2, $V_T$: thermal voltage, $I_{EE}$: the current of the current source connected in serial to the common node of emitters of a transistor 1 and 2, $I_V$: the valley current of a negative differential resistance diode 1 and 2, $I_P$: the peak current of a negative differential resistance diode 1 and 2); and thereby providing a single or differential outputs in case that Band $V_{IN}$ and $V_{REF}$ are respectively supplied as each input of said transistor 1 and 2.

Moreover, the invention is directed to present MOBILE based D-type flip flop circuit, which is characterized by including a negative differential resistance diode 1 and 2 receiving a common clock signal, and a commonly biased negative differential resistance diode 3 and 4 by respectively being connected in serial, and a transistor 1 and 2 in which each collector is respectively connected inbetween said, negative differential resistance diode 1 and 3 and inbetween said negative differential resistance diode 2 and 4, each emitter is commonly connected to a common current source, and each base is to be input port; and being operated in Non-Return-to-Zero mode, in which each collector of said transistor 1 and 2 is respectively connected to the base of transistor 1 and 2 for said SET/RESET latch circuit, and an output port is connected to the collector of said SET/RESET latch circuit.

Hereinafter, referring to appended drawings, the structures and operating principles for the embodiments of present invention are described in detail.

The present invention can be applied to all the technologies based on all kinds of 3-port transistors including BJT, FET, etc., hereinafter, the explanations of drawings will be based on HBT which has the highest operating speed among BJT's. Though the technologies proposed in the present invention can also be applied to all the diodes with negative differential resistance characteristics, the description, hereinafter, will be based on InP based RTD(Resonant Tunneling Diode) having low peak voltage and high PVCR(Peak-to-Valley Current Ratio) even at room temperature.

Figure 3:
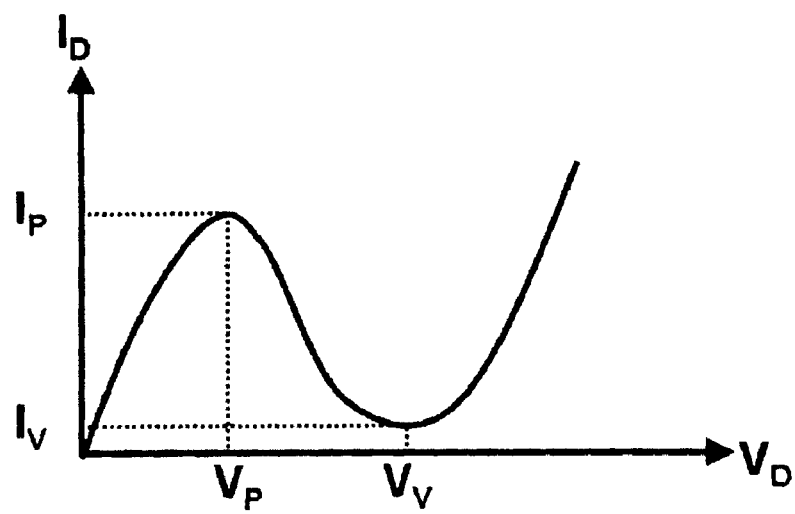
FIG. 3 is DC I-V characteristics of a negative differential resistance diode in accordance with the present invention.

FIG. 3 shows DC I-V characteristics of RTD used in the circuit proposed in the invention. When $V_D$ is in the range of $0<V_D<V_P$, PDR1(Positive Differential Resistance 1) characteristics in which the current increases in proportion to the voltage is appeared, and NDR(Negative Differential Resistance) characteristics is appeared in the range of $V_P<V_D<V_V$. PDR2 characteristics is appeared again in the range of $V_D>V_P$. Wherein, the current for voltage $V_P$ is represented as peak current($I_P$), and the current for voltage $V_V$ is represented as valley current($I_V$).

Figure 4:
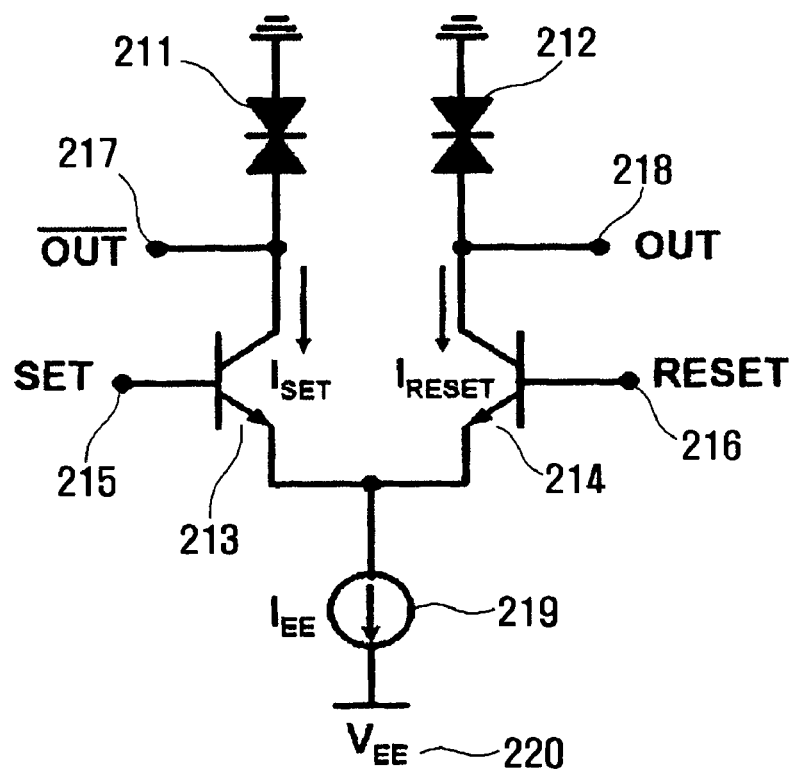
FIG. 4 is a SET/RESET latch circuit with differential outputs in accordance with the present invention, which is configured with negative differential resistance diodes and CML-type transistors.

FIG. 4 shows CML-type SET/RESET latch(SR latch) circuit proposed in the present invention. The SET/RESET latch circuit is configured in that RTD(211, 212) are respectively connected to transistors(213, 214) in serial, and the emitters of transistors(213, 214) are commonly connected to the current source(219) in serial. Moreover, the load characteristics illustrating the operation of SET/RESET latch circuit is shown in FIG. 5a and FIG. 5b.

Figure 5A:
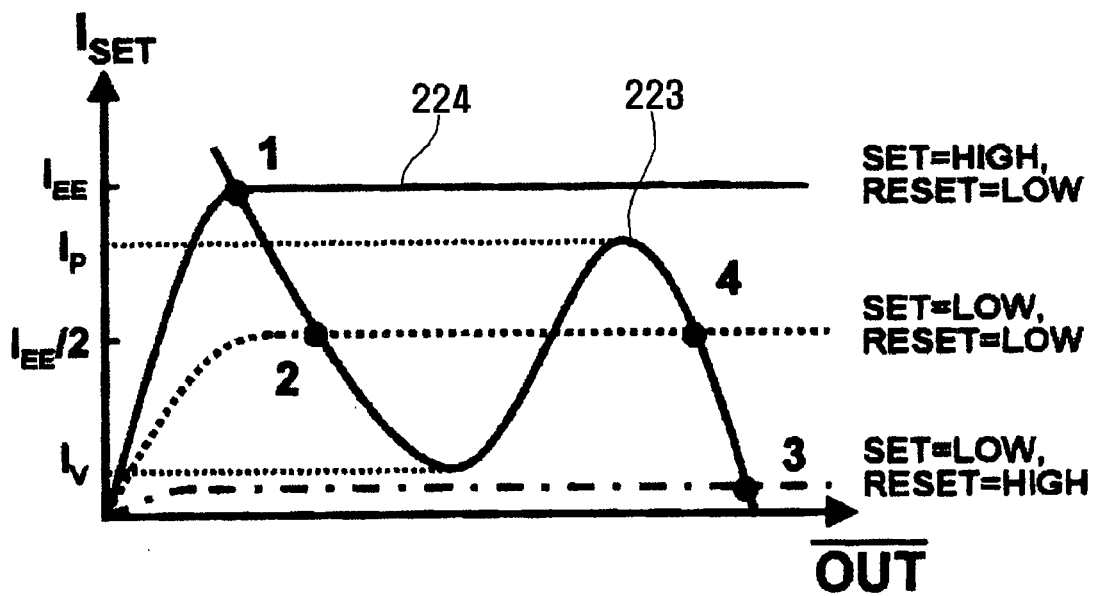
FIGS. 5a and 5b are DC I-V characteristics illustrating operating principles of SET/RESET latch circuit using negative differential resistance diodes of FIG. 4.
Figure 5B:
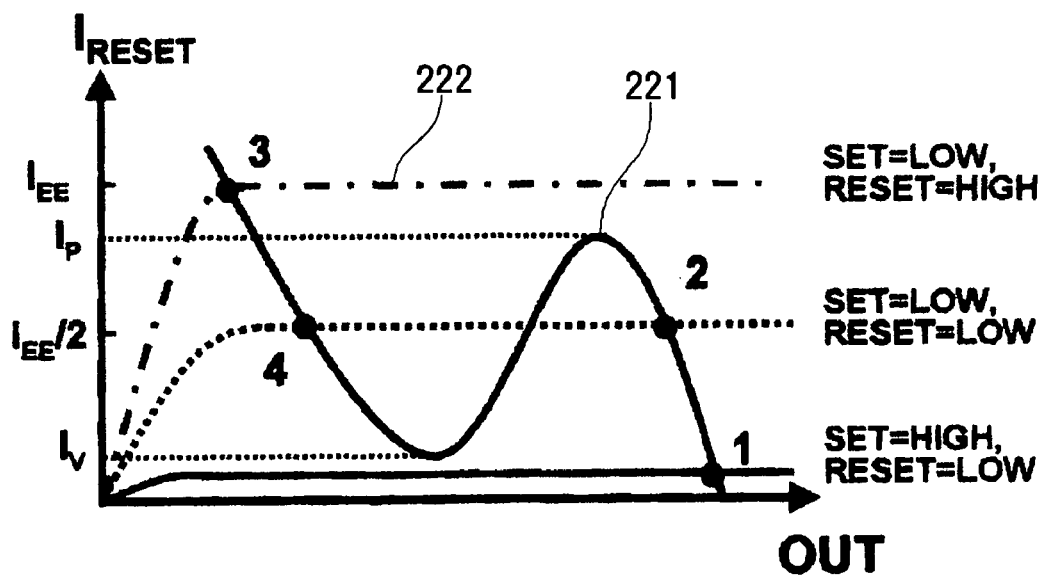

FIG. 5a is load-line characteristics between the inverted output port(217) and the current($I_{SET}$) of the circuit configured with a serial connection of RTD(211) and transistor(213). FIG. 5b is load-line characteristics between the output port (218) and the current($I_{RESET}$) of the circuit configured by the serial connection of RTD(212) and transistor(214). There are only three kinds of states, (SET, RESET)=(LOW, LOW), (LOW, HIGH), (HIGH, LOW) in RZ mode signals applied to the input SET and RESET ports of SET/RESET latch circuit. Since transistors(213, 214) are configured with CML-type, the sum of $I_{SET}$ and $I_{RESET}$ which are the currents of each transistor should be equal to the current $I_{EE}$ of the current source. [Table 1] shows the values of $I_{SET}$ and $I_{RESET}$ according to the states of SET and RESET.

TABLE 1

| SET | RESET | $I_{SET}$ | $I_{RESET}$ |
|---|---|---|---|
| LOW | LOW | $I_{EE}/2$ | $I_{EE}/2$ |
| LOW | HIGH | 0 | $I_{EE}$ |
| HIGH | LOW | $I_{EE}$ | 0 |
| HIGH | HIGH | Not exist | |

As the above [Table 1], since $I_{SET}=I_{EE}$, $I_{RESET}=0$ in case that (SET, RESET)=(HIGH, LOW), output voltages OUT and /OUT (bar) which are in the state 1 as shown in load-line characteristics of FIG. 5a and FIG. 5b are transited to HIGH and LOW states, respectively. Since $I_{SET}=I_{RESET}=I_{EE}/2$ in case that (SET, RESET)=(LOW, LOW), output voltages which are in the state 2 as shown in the load-line characteristics of FIG. 5a and FIG. 5b are preserved in the previous states. Since $I_{SET}=0$, $I_{RESET}=I_{EE}$ in case that (SET, RESET)= (LOW, HIGH), output voltages are transited to state 3 as shown in the load-line characteristics of FIG. 5a and FIG. 5b.

These operations are for SET/RESET latch circuit, in which NRZ mode output signal is produced from RZ mode input signal supply. For the correct operations of SET/RESET latch circuit, the condition between the peak current of RTD(211, 212) and the current source(219) as shown in [Equation 1] should be satisfied.

$$I_P<I_{EE}<2\cdot I_P \quad \text{[Equation 1]}$$

Where, $I_{EE}$=the current of the current source connected in serial to the common node of emitters of transistor 1 and 2, $I_P$=the peak current of a negative differential resistance diode(RTD) 1 and 2.

Figure 6:
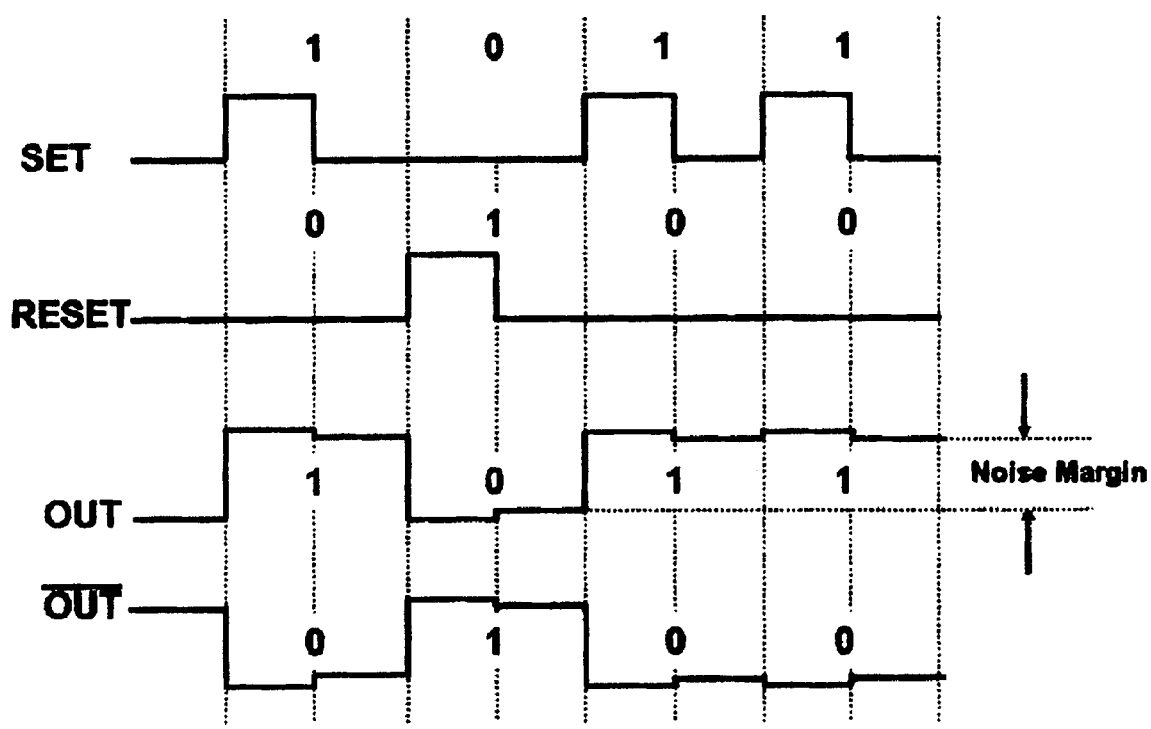
FIG. 6 is timing diagrams illustrating the operations of SET/RESET latch circuit of FIG. 4.

FIG. 6 shows timing diagrams for the operation of SET/RESET latch circuit. It can be identified that output voltage (218) produces 1011(NRZ-mode) and inverted output port (217) produces 0100, in case that RZ-mode SET=1011, RESET=0100 are applied to SET/RESET latch circuit. When the output level is 1 in FIG. 6, the output voltage difference between the case that (SET, RESET)=(HIGH, LOW) and the case that (SET, RESET)=(LOW, LOW) is caused by the fact that the output voltages of state 1 and state 2 are different by PDR1 characteristics of RTD as shown in FIG. 5b. When the output level is 0 in FIG. 6, the output voltage difference between the case that (SET, RESET)=(LOW, HIGH) and the case that (SET, RESET)=(LOW, LOW) is caused by the fact that the output voltages of state 3 and state 4 are different by PDR2 characteristics of RTD as shown in FIG. 5b. Thus, the noise margin of SET/RESET latch circuit becomes the voltage difference in state 2 and state 4 of FIG. 5a and FIG. 5b. New techniques for improving the noise margin are presented in the followings.

Figure 7:
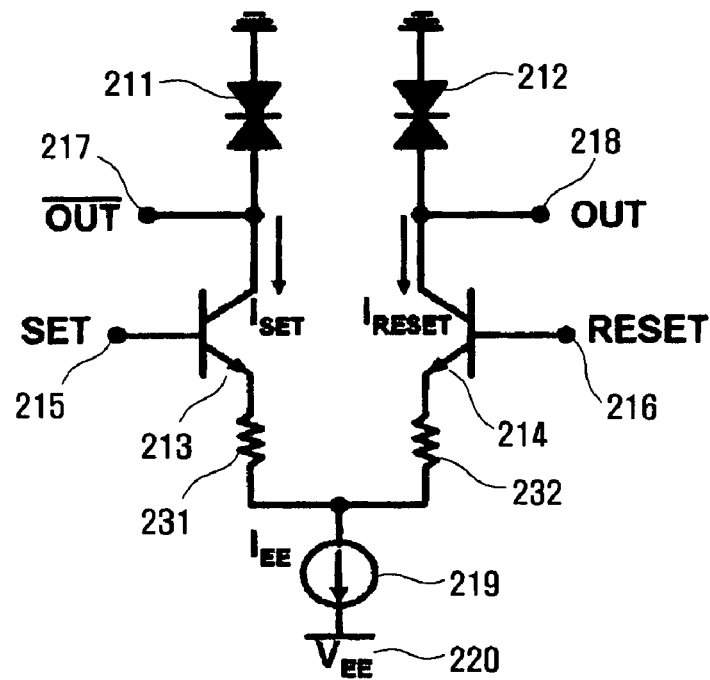
FIG. 7 is a circuit diagram for reducing sensitivity of input voltages in SET/RESET latch circuit by including resistors on emitters of CML-type transistors in SET/RESET latch circuit of FIG. 4.

FIG. 7 shows a circuit including degeneration resistors on emitters of transistors 213 and 214 for reducing input sensitivity of SET/RESET latch circuit occurring by the voltage difference of SET and RESET ports. When degeneration resistors are included, the voltage difference between SET and RESET ports that makes the output of SET/RESET latch circuit be transited is increased to the amount of the voltage drop between degeneration resistors, thereby the input sensitivity of SET/RESET latch circuit can be reduced.

Figure 8:
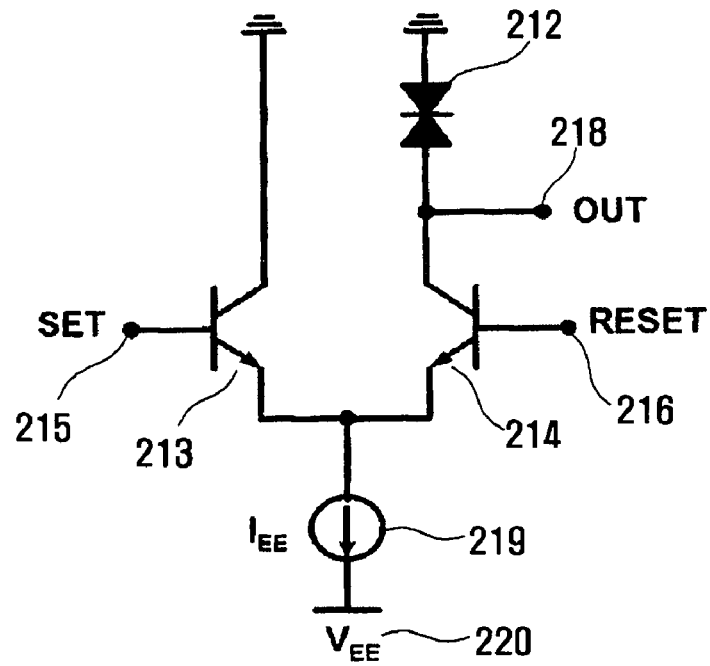
FIG. 8 is a circuit diagram for SET/RESET latch circuit with a single output using CML-type transistors and a negative differential resistance diode, in accordance with the present invention.

FIG. 8 shows SET/RESET latch circuit with a single output eliminating RTD(211) in SET/RESET latch circuit with differential outputs shown in FIG. 4.

Figure 9:
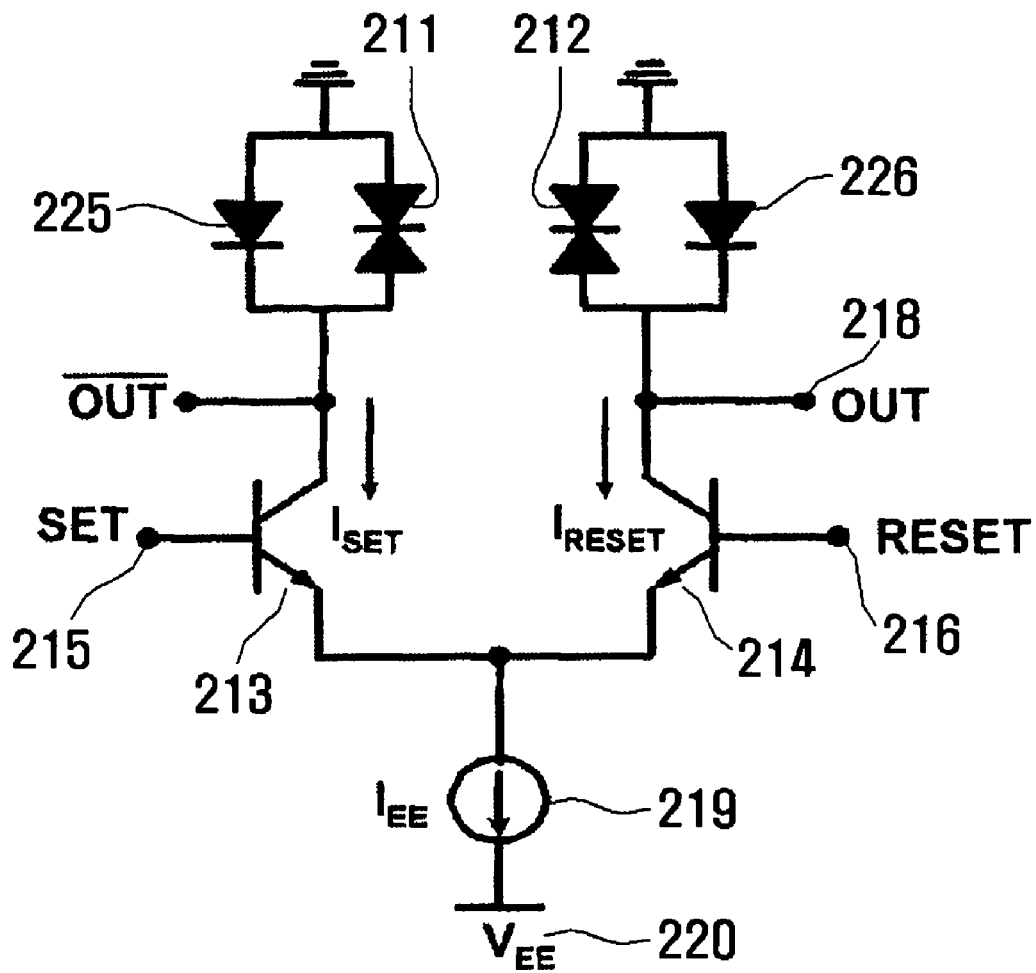
FIG. 9 is a circuit diagram for SET/RESET latch circuit with differential outputs, in which a negative differential resistance diode and a junction diode or a Schottky diode are connected in parallel, in accordance with the present invention.

FIG. 9 shows a circuit reducing the output voltage difference between holding state caused by the fact that SET and RESET become LOW and the state that output is in LOW, as shown in FIG. 5a and FIG. 5b. The voltage difference can be reduced in the state that output is in LOW, by increasing the current in PDR2 region for the circuit connecting PN junction diodes(or Schottky diodes) 225, 226 to both ends of RTD in parallel.

Figure 10A:
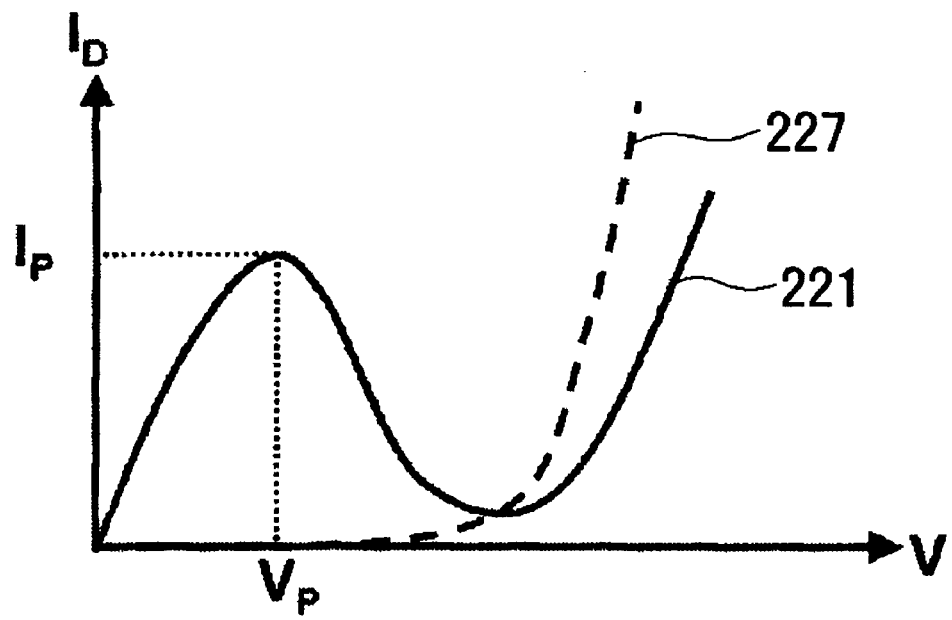
FIGS. 10a and 10b are DC I-V characteristics illustrating operating principles of SET/RESET latch circuit with differential outputs, in which a negative differential resistance diode and a junction diode or a Schottky diode are connected in parallel, in accordance with the present invention.
Figure 10B:
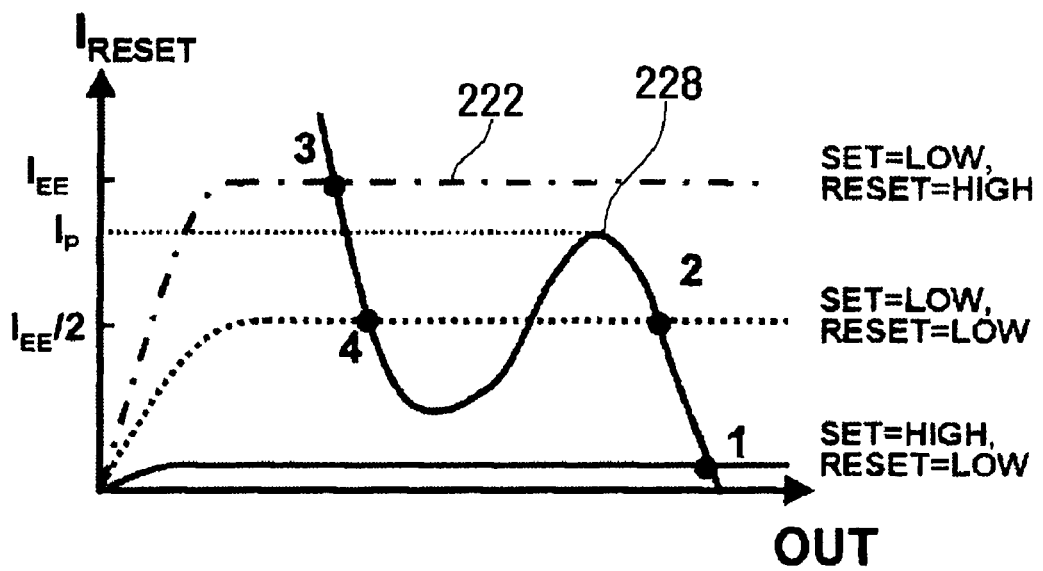

FIG. 10a shows DC I-V characteristics(221) of RTD and DC I-V characteristics (227) of parallel connected diode. As shown in FIG. 10a, if two diodes(221, 227) are connected in parallel and the turn-on voltage of parallel connected diode (227) is similar to the valley voltage($V_V$) of RTD, the current of PDR2 region in which the voltage $V_D$ of parallel connected circuit is bigger than $V_V$ is abruptly increased, and thus the DC I-V characteristics as shown in FIG. 10b is appeared. At this time, the voltage difference between state 3 and state 4 becomes smaller than the case for FIG. 5a and FIG. 5b, thereby the output voltage difference is decreased in case that output voltage is in LOW, and thereby the output voltage characteristics is improved.

Figure 11:
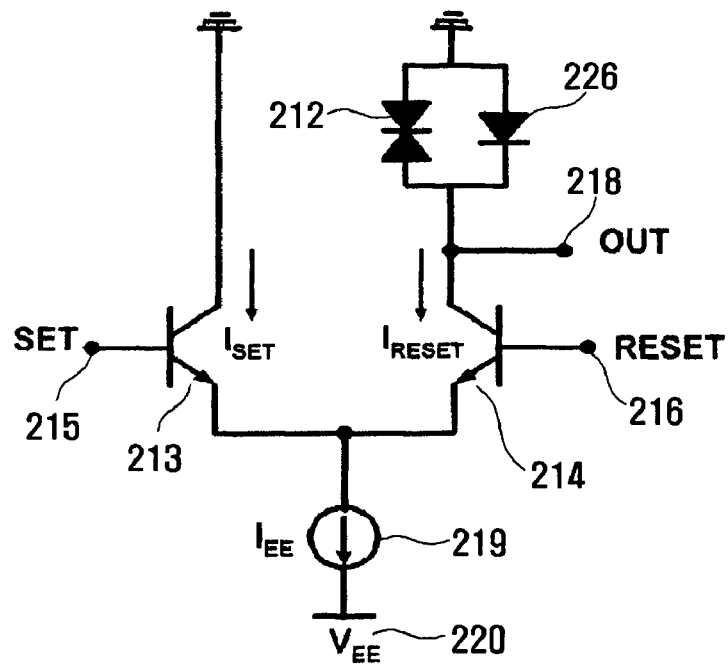
FIG. 11 is a circuit diagram for SET/RESET latch circuit with a single output, in which a negative differential resistance diode and a junction diode or Schottky diode are connected in parallel, in accordance with the present invention.

FIG. 11 shows SET/RESET latch circuit with a single output by eliminating RTD(211) and its parallel connected diode(225) of FIG. 9.

Figure 12:
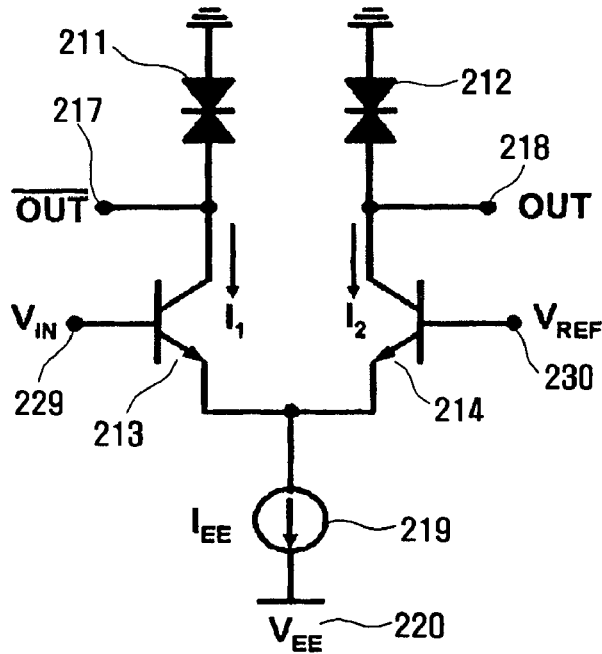
FIG. 12 is a circuit diagram for Schmitt trigger with differential outputs using CML-type transistors and negative differential resistance diodes, in accordance with the present invention.

FIG. 12 shows Schmitt trigger circuit with differential outputs by replacing SET port with $V_{IN}$(229) and RESET port with $V_{REF}$(230) from the basic SET/RESET latch circuit of FIG. 4. The operations of Schmitt trigger circuit in accordance with the present invention are shown in FIG. 13.

Figure 13:
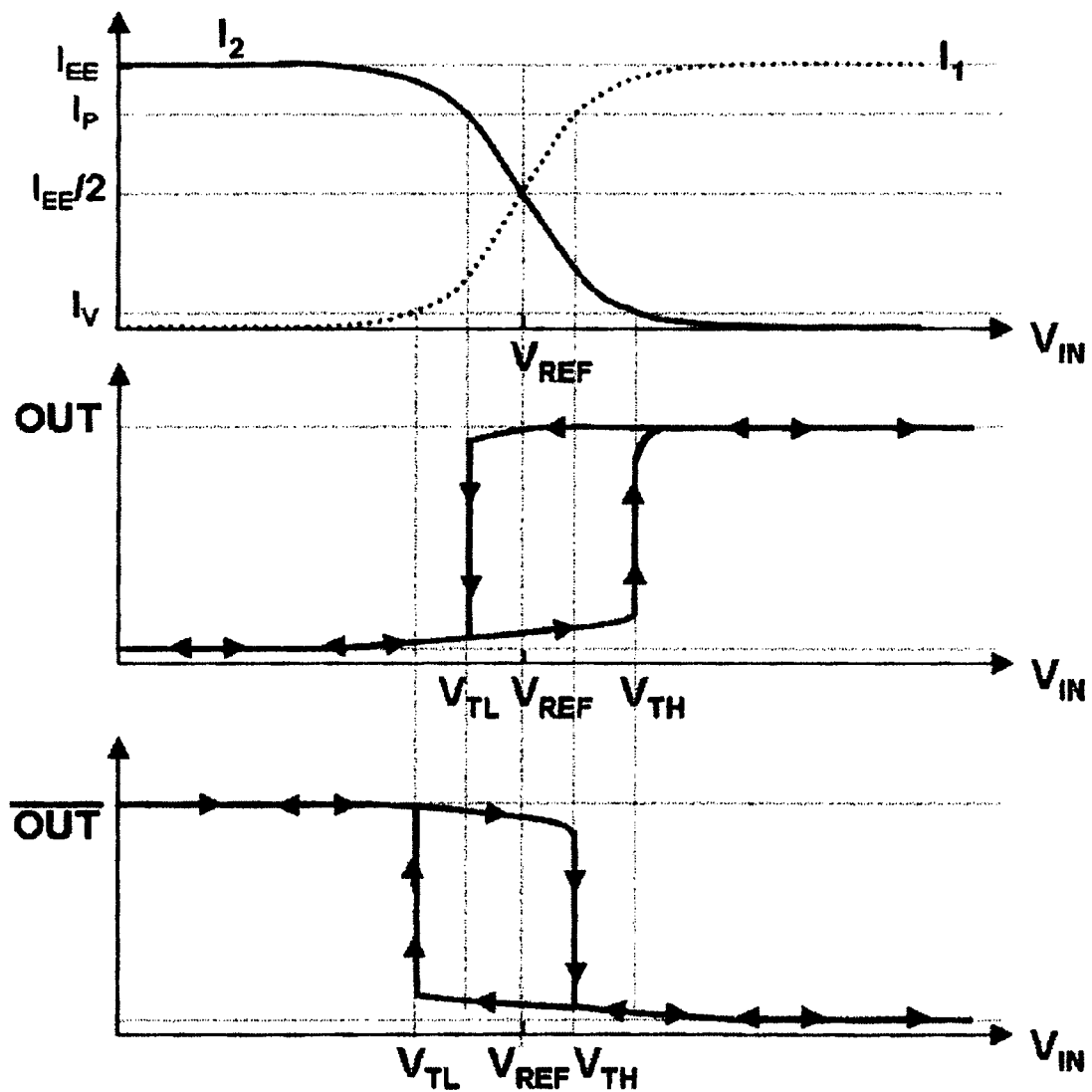
FIG. 13 is input-output characteristics illustrating operating principles for Schmitt trigger circuit with differential outputs using CML-type transistors and negative differential resistance diodes, in accordance with the present invention.

FIG. 13 shows current characteristics of each collector for transistors 213 and 214 according to the voltage applied to $V_{IN}$(229), and also shows output voltage(218) and inverted output voltage(217). The current equation of each transistor (assuming BJT) in accordance with $V_{IN}$ and $V_{REF}$ is shown in [Equation 2].

$$I_1 = \frac{I_{EE}}{1 + \exp\left(-\frac{V_{IN} - V_{REF}}{\eta V_T}\right)},$$

$$I_2 = \frac{I_{EE}}{1 + \exp\left(\frac{V_{IN} - V_{REF}}{\eta V_T}\right)}$$

[Equation 2]

Where, $V_{IN}$: input voltage of transistor 213
$V_{REF}$: reference voltage of transistor 214
$\eta$: ideality factor of transistor 213 and 214
$V_T$: thermal voltage In case that the voltage applied to $V_{IN}$(229) is sufficiently smaller than $V_{REF}$(230), $I_1$ becomes zero($I_1$=0) and $I_2$ becomes $I_{EE}$($I_2$=$I_{EE}$). At this time, the state of output voltage(240) becomes LOW. If the voltage $V_{IN}$(229) is gradually increased, the current $I_2$ is gradually decreased as shown in FIG. 13. As shown in FIG. 5b, since the operating point jointing $I_2$ and output voltage is continuously preserved in PDR2 regime of RTD until $I_2$ of RTD is more than valley current($I_V$). Thus, the state output voltage becomes LOW. As $V_{IN}$ gradually increases, the current $I_2$ gradually decreases, and then when the level of $I_2$ is lower than $I_V$, operating point moves to PDR1 regime of RTD, and thereby output voltage is transited to HIGH state.

At the state that the level of $V_{IN}$ is sufficiently higher than $V_{REF}$, operating point is in PDR1 regime of RTD as shown in FIG. 5b, and thus output voltage becomes to be in HIGH state. From this state, while $I_2$ is gradually increased according to the decrement of $V_{IN}$, operating point continuously exists in PDR1 regime until the level of $I_2$ is lower than $I_P$, and thereby the output still becomes to be in HIGH state. If the level of $I_2$ becomes to be higher than that of $I_P$, operating point moves to PDR2 regime of RTD, and thus the state of output voltage is transited to LOW. The above operations are shown in FIG. 13 as graphs for the relationship between OUT and /OUT(bar), and $V_{IN}$. This characteristics of the circuit is the same as that of Schmitt trigger circuit with threshold voltages $V_{TH}$ and $V_{TL}$. The same characteristics is also appeared for inverted output voltage(217). Threshold voltages($V_{TH}$, $V_{TL}$) in Schmitt trigger circuit implemented with RTDs and CML type transistors are described as [Equation 3].

$$V_{TH} = \eta V_T \ln\left(\frac{I_{EE}}{I_V} - 1\right) + V_{REF}$$

$$V_{TL} = \eta V_T \ln\left(\frac{I_{EE}}{I_P} - 1\right) + V_{REF}$$

[Equation 3]

Where, $V_{TH}$, $V_{TL}$: threshold voltages of the Schmitt trigger circuit
$\eta$: ideality factor of transistor 213 and 214
$V_T$: thermal voltage $I_{EE}$: the current of the current source connected in serial to the common node of emitters of transistor 213 and 214
$I_V$: the valley current of negative differential resistance diode 211 and 212
$I_P$: the peak current of a negative differential resistance diode(RTD) 211 and 212.

As shown in [Equation 3], Schmitt trigger circuit with desired threshold voltages can be implemented by adjusting the provided current characteristics of RTD and current of current source(219).

Figure 14:
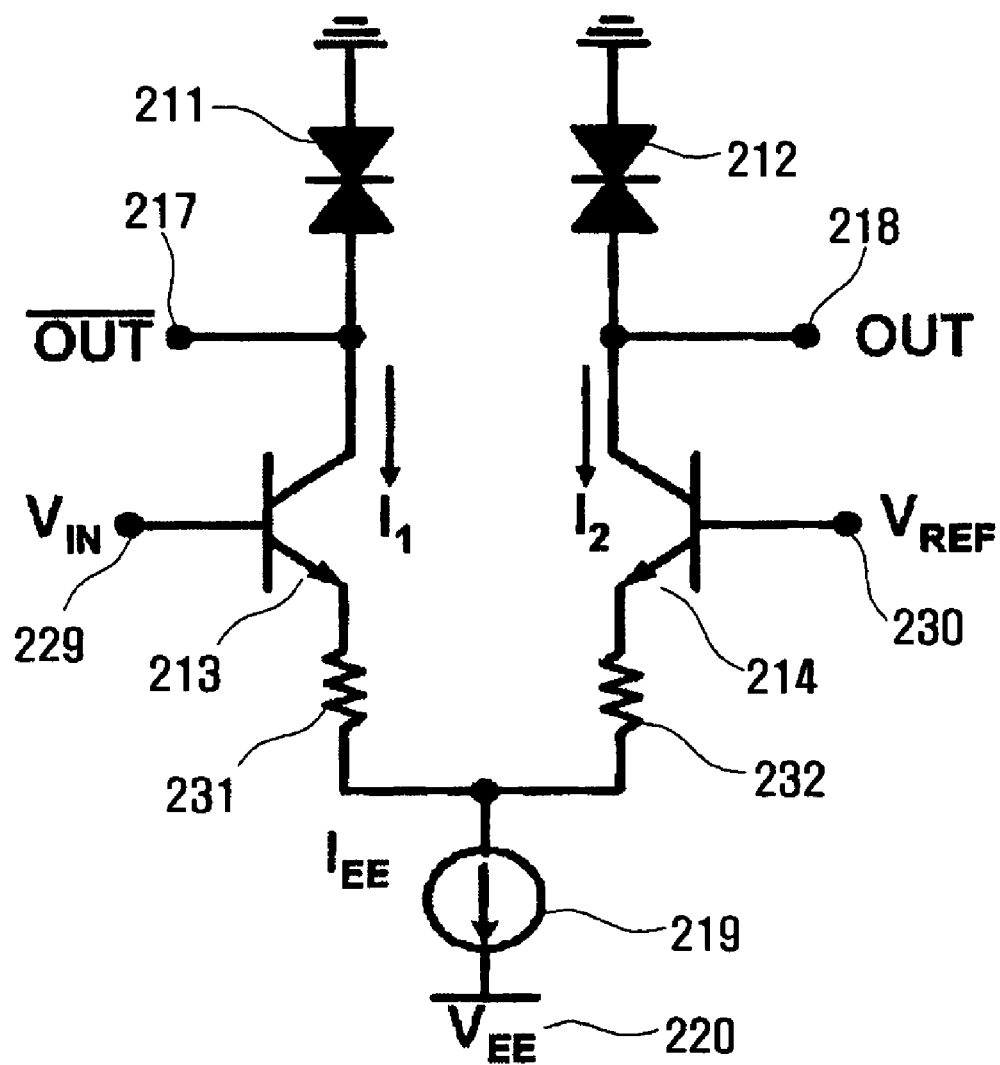
FIG. 14 is a circuit diagram for Schmitt trigger circuit in which threshold voltages($V_{TH}$, $V_{TL}$) can be increased by including a degeneration resistor on each emitter of CML-type transistors of FIG. 12.
Figure 15:
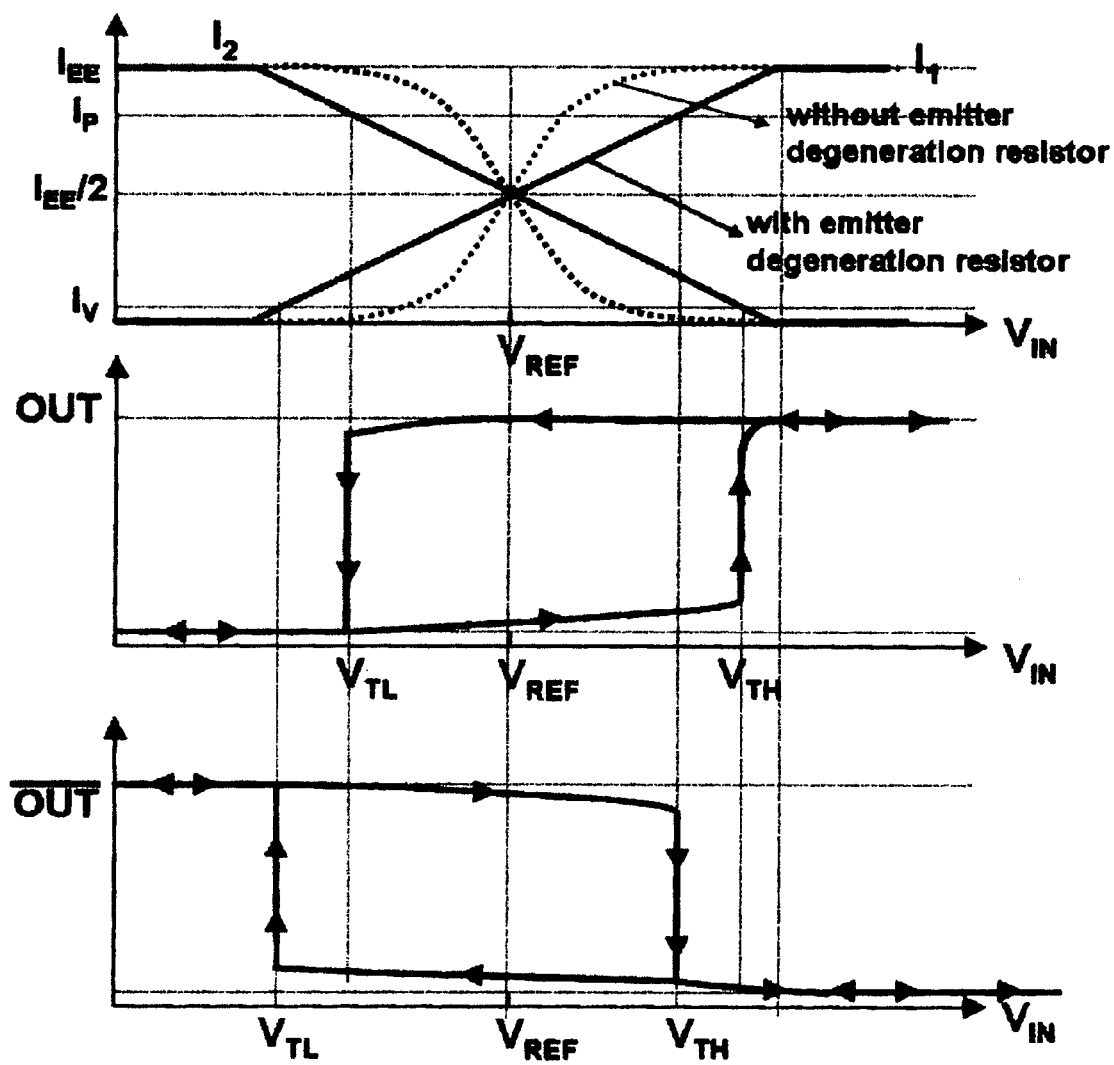
FIG. 15 is input-output characteristics illustrating operating principles for Schmitt trigger circuit in which threshold voltages($V_{TH}$, $V_{TL}$) can be increased by including a degeneration resistor on each emitter of CML-type transistors, as shown in FIG. 14.

FIG. 14 shows a circuit including degeneration resistors on the emitter ports of CML-type transistors of the circuit in FIG. 12. Said circuit can increase the difference between threshold voltages $V_{TH}$ and $V_{TL}$ by including degeneration resistors. The operations are shown in FIG. 15. As shown in FIG. 15 for the graphs on currents $I_1$ and $I_2$ for $V_{IN}$, the currents $I_1$ and $I_2$ of the circuit with supplemental degeneration resistors on emitters are changed with more gentle gradient than those of the circuit without degeneration resistors. Thus, it can be identified that threshold voltages according to $V_{IN}$ are triggered in larger area than those for FIG. 13.

Figure 16:
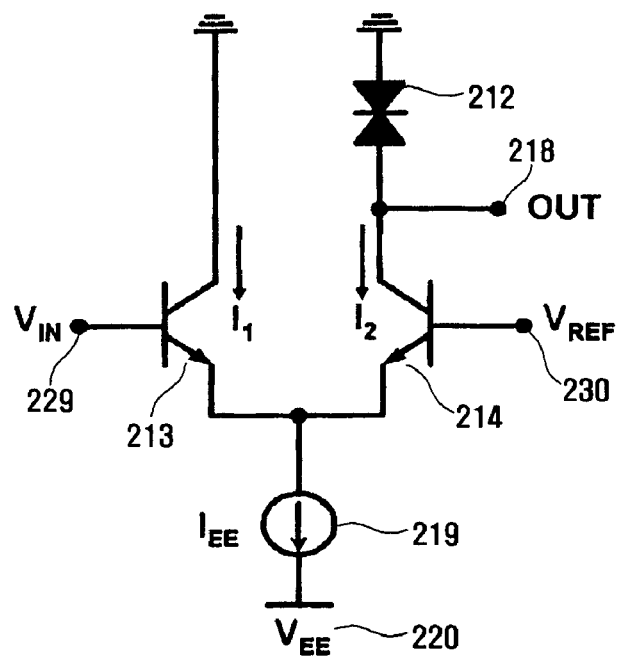
FIG. 16 is a circuit diagram for Schmitt trigger circuit with a single output using CML-type transistors and a negative differential resistance diode, in accordance with the present invention.

FIG. 16 shows Schmitt trigger circuit with a single output by removing RTD(211) from Schmitt trigger circuit with differential outputs of FIG. 12.

Figure 17:
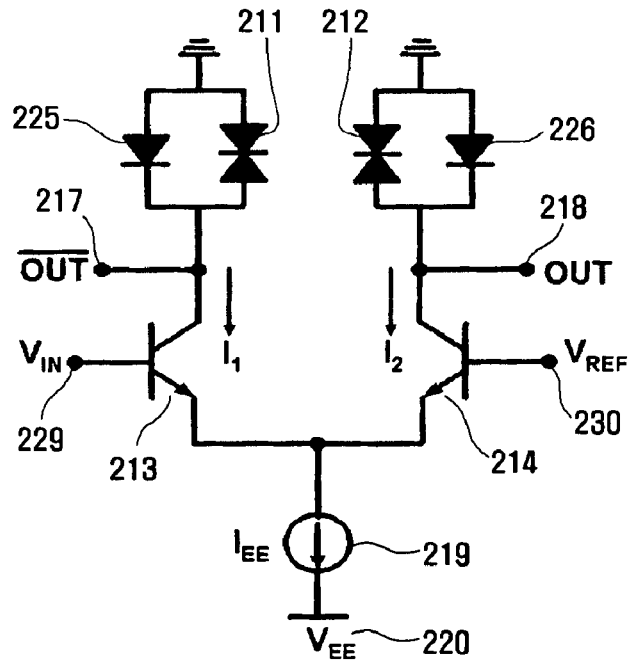
FIG. 17 is a circuit diagram for Schmitt trigger circuit with differential outputs, in which a negative differential resistance diode and a junction diode or a Schottky diode are connected in parallel, in accordance with the present invention.

FIG. 17 shows Schmitt trigger circuit with differential outputs, which is capable of changing threshold voltages by adjusting $I_P$ and $I_V$ like [Equation 3] through the parallel connection of RTD(211, 212) and additional diodes(225, 226). In real implementation of RTD(211, 212), the ratio of values for $I_P$ and $I_V$ is constant. Therefore, there is a limitation for changing threshold voltages through [Equation 3]. For the purpose of solving this problem, an additional diode is connected to both ends of RTD(211, 212) in parallel, thereby while the peak current($I_P$) of RTD is preserved, the valley current($I_V$) of entire diodes connected in parallel according to the area of diodes(225, 226) is increased, and thus degree of freedom for changing threshold voltages can be enhanced.

Figure 18:
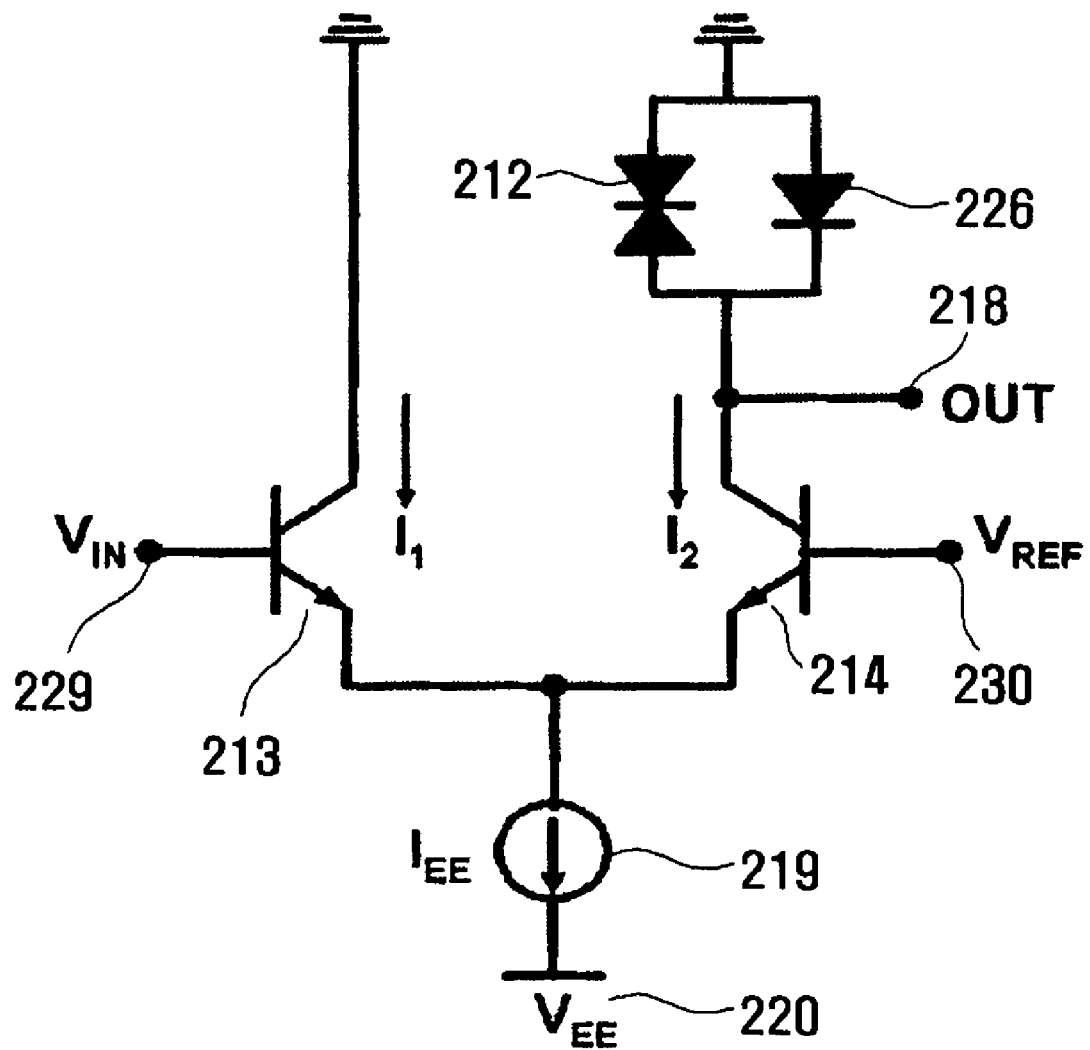
FIG. 18 is a circuit diagram for Schmitt trigger circuit with a single output, in which a negative differential resistance diode and a junction diode or a Schottky diode are connected in parallel, in accordance with the present invention.

FIG. 18 shows Schmitt trigger circuit with a single output by removing RTD(211) and a diode(225) from the Schmitt trigger circuit with differential outputs of FIG. 17.

Figure 2:
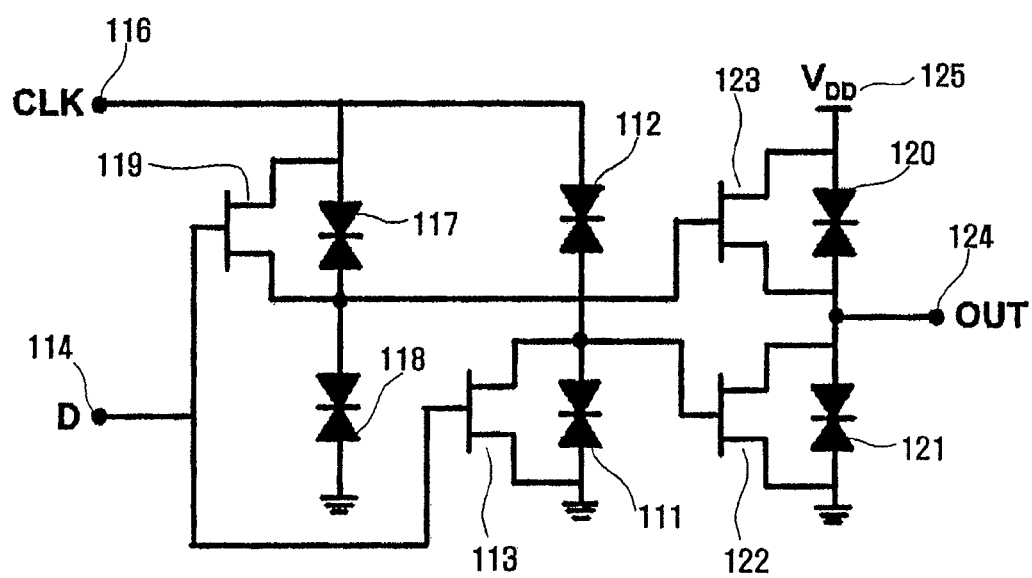
FIG. 2 is an NRZ mode D-type flip flop circuit configured with existing MOBILE circuit and SET/RESET latch circuit in accordance with prior arts.
Figure 19A:
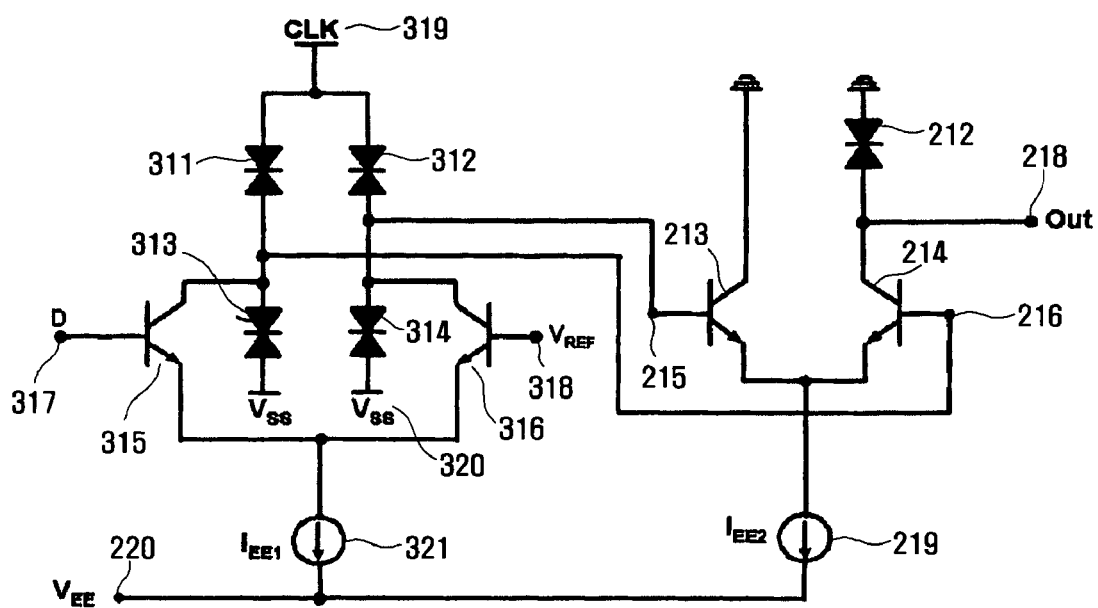
FIG. 19a is a circuit diagram for MOBILE based Non-Return-to-Zero(NRZ) mode D-type flip flop circuit with a single input and a single output, in accordance with the present invention.

FIG. 19a shows the NRZ-mode D-type flip flop circuit with single input-single output implemented by using SET/RESET latch circuit proposed in the present invention. There is basically required the circuit with RZ mode complementary outputs for implementing D-type flip flop circuit using SET/RESET latch circuit. As shown in FIG. 2, though it can be implemented by using two MOBILE circuits, it is very difficult to achieve very high speed operation in that parallel connected transistors 113 and 119 operate at the state that the drain-source voltage of said transistors is approximately 0.3V peak voltage of RTD(111, 117) in case of the MOBILE circuit in FIG. 2. With a view to solving this problem, a CML-type MOBILE circuit with complementary outputs using CML-type input driver circuit is used as in Korea patent(filing no. 10-2004-0110360, Tunneling Diode Logic Circuit using Current Mode Logic-type input driving circuit configuration and MOnostable Bistable Transition Logic Element(MOBILE)). The CML-type MOBILE circuit with complementary outputs comprises two pairs of serially connected RTD, (311, 313) and (312, 314), transistors(315, 316) for CML-type input driving, and the current source(321) for supplying the current to transistors. The collectors of CML-type transistors (315, 316) are respectively connected in between serially connected RTD, and thereby current is supplied for the operation of MOBILE circuit through said transistors. Current is adjusted by input port(317) and reference voltage(318). If the voltage level of input port(317) is sufficiently higher than that of reference voltage(318), SET becomes HIGH and RESET becomes LOW in the state that CLK(319) is in HIGH. In the state that CLK is in LOW, both SET and RESET become LOW by the operating principle of the CML-type MOBILE circuit. Moreover, in the state that the level of input port(317) is lower than that of reference voltage(318), SET becomes LOW and RESET becomes HIGH.

Figure 19B:
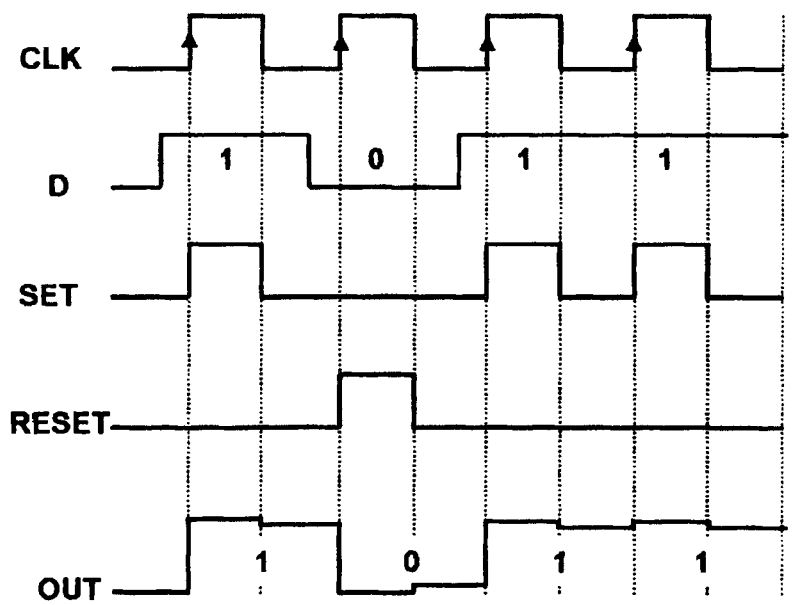
FIG. 19b is timing diagrams illustrating the operations of MOBILE based Non-Return-to-Zero(NRZ) mode D-type flip flop circuit with a single input and a single output, in accordance with the present invention.

FIG. 19b shows timing diagram of NRZ mode D-type flip flop circuit implemented by using the CML-type MOBILE circuit with complementary outputs and SET/RESET latch circuit. If NRZ mode 1011 signal is applied to input D(317) and CLK(319) is supplied, RZ mode 1011 signal is applied to SET port(215) as input of SET/RESET latch circuit, and RZ mode 0100 signal is applied to RESET port(216) as input of SET/RESET latch circuit. For these SET and RESET inputs, output port(218) is preserved in HIGH state for (SET, RESET)=(HIGH, LOW), output port(218) is preserved in HIGH state for (SET, RESET)=(LOW, LOW), and output port(218) is transited to LOW state for (SET, RESET)= (LOW, HIGH). Thus, the circuit of FIG. 19a operates as NRZ mode D-type flip flop circuit with a single input and a single output.

Figure 20:
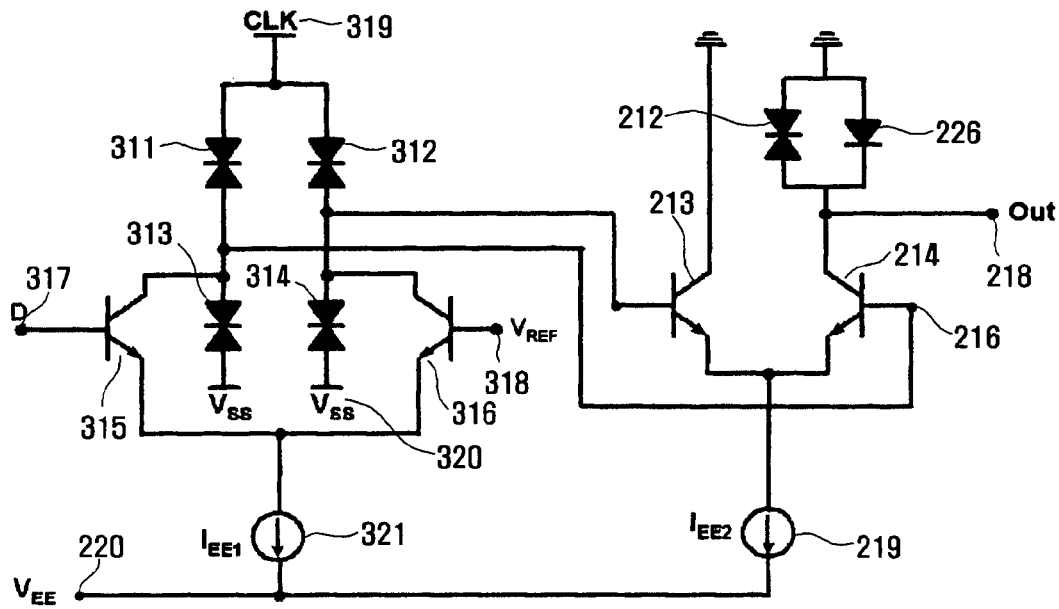
FIG. 20 is a circuit diagram for MOBILE based NRZ mode D-type flip flop circuit with a single input and a single output using the SER/RESET latch circuit in which a negative differential resistance diode and a junction diode or a Schottky diode are connected in parallel, in accordance with the present invention.

FIG. 20 shows NRZ mode D-type flip flop circuit with a single input and a single output, which is implemented by using SET/RESET latch circuit in which RTD(212) and additional diode(226) such as PN junction diode or Schottky diode are connected in parallel, and the CML-type MOBILE circuit with complementary outputs.

Figure 21:
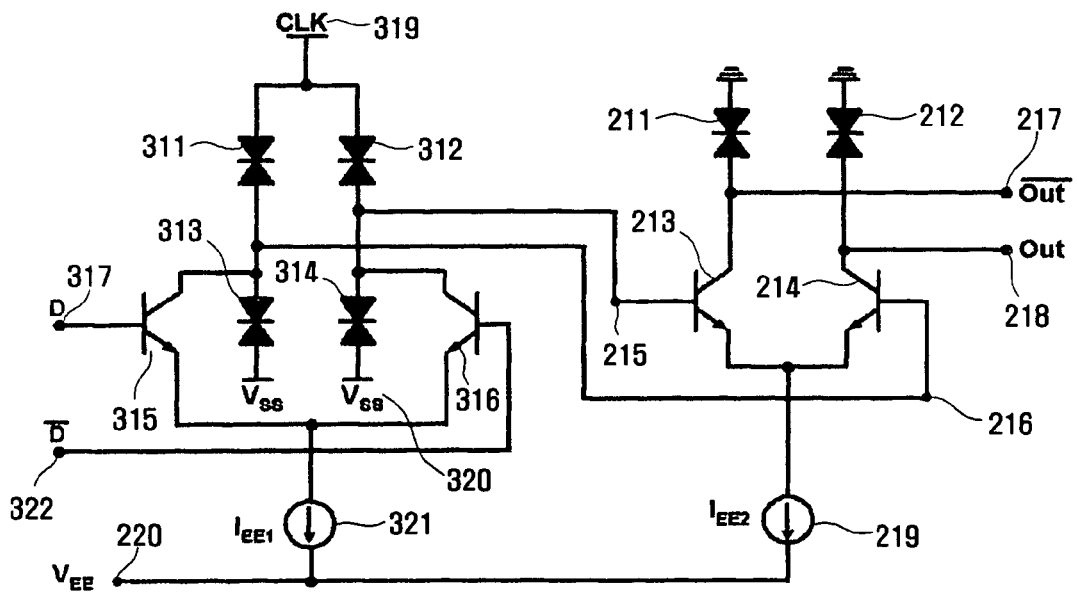
FIG. 21 is a circuit diagram for MOBILE based NRZ mode D-type flip flop circuit with differential inputs and differential outputs, in accordance with the present invention.

FIG. 21 shows NRZ mode D-type flip flop circuit with differential inputs and differential outputs. For achieving compatibility with the conventional digital circuits, the circuit with differential inputs and differential outputs is required. For this reason, NRZ mode D-type flip flop circuit capable of supplying differential inputs can be implemented by replacing reference voltage(318) of FIG. 19b with inverted input(232).

Figure 22:
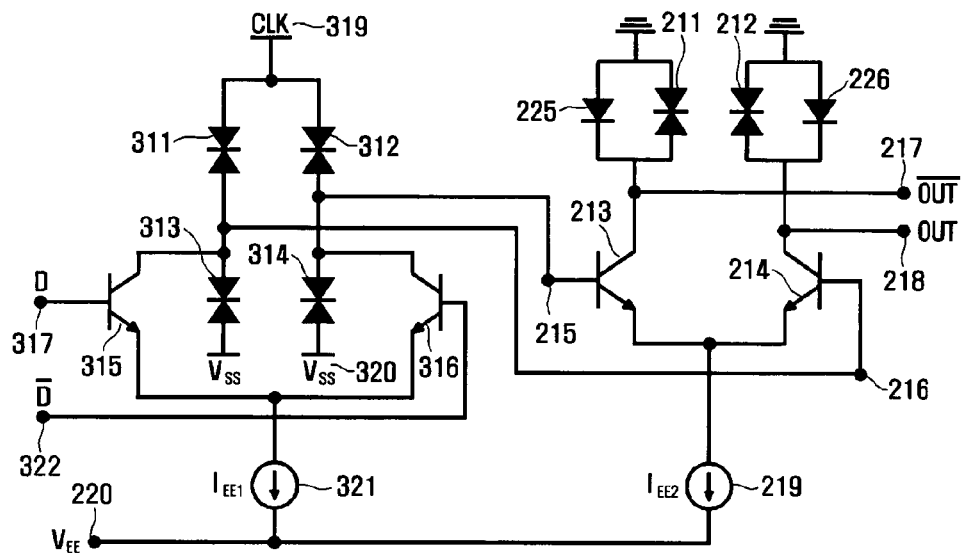
FIG. 22 is a circuit diagram for MOBILE based NRZ mode D-type flip flop circuit with differential inputs and differential outputs in which a negative differential resistance diode and a junction diode or a Schottky diode are connected in parallel, in accordance with the present invention.

FIG. 22 shows NRZ mode D-type flip flop circuit with differential inputs and differential outputs, which is implemented by using SET/RESET latch circuit in which RTD (211, 212) and additional diodes(225, 226) are connected in parallel and the CML-type MOBILE circuit with complementary outputs.

Since the circuit implemented in the present invention is used for very high speed digital circuit(more than 40 Gb/s), impedance matching for this very high speed operation should be taken into account. Moreover, there needs an output buffer for achieving compatibility with the circuits configured with ECL(Emitter Coupled Logic) and SCFL(Source Coupled FET Logic), in order to be connected to the next stage of D-type flip flop circuit.

Figure 23:
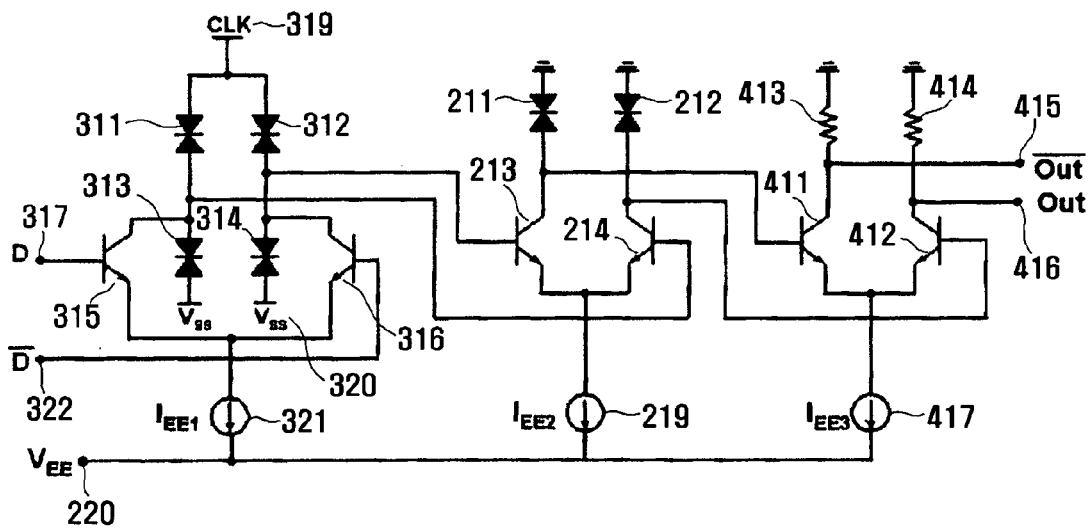
FIG. 23 is a circuit diagram connecting CML-type output buffers to MOBILE based NRZ mode D-type flip flop circuit with differential inputs and differential outputs, in accordance with the present invention.

By including CML-type common-emitter buffer to NRZ mode D-type flip flop circuit with differential inputs and differential outputs as shown in FIG. 23, impedance matching and compatibility with ECL and SCFL are easily achieved.

Figure 24:
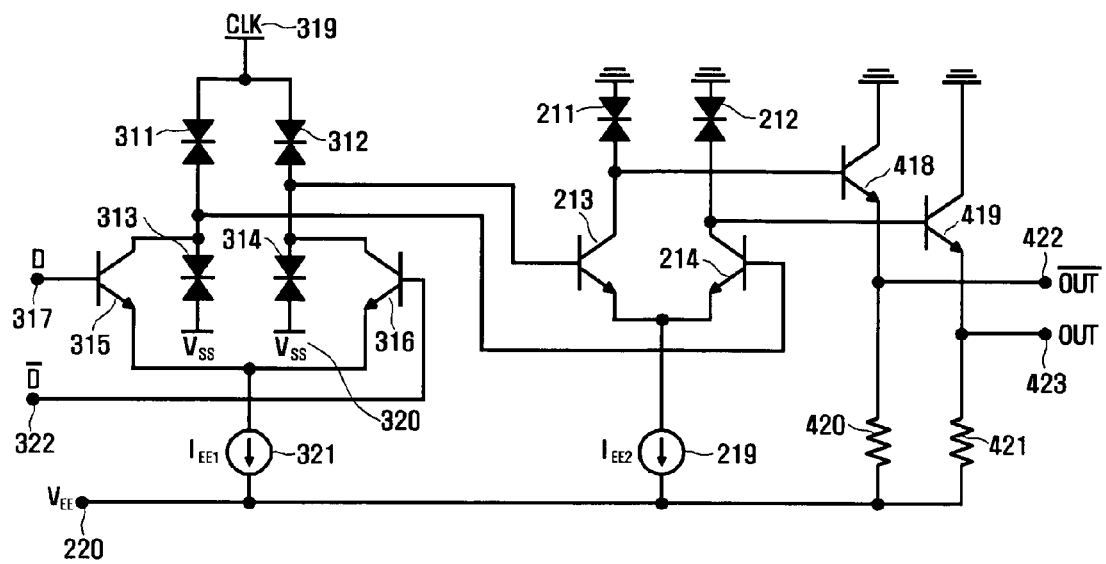
FIG. 24 is a circuit diagram connecting emitter followers as output buffers to MOBILE based NRZ mode D-type flip flop circuit with differential inputs and differential outputs, in accordance with the present invention.

FIG. 24 shows a circuit using emitter-follower as output buffer for the same voltage level between input and output of NRZ mode D-type flip flop circuit proposed in the present invention.

Figure 25A:
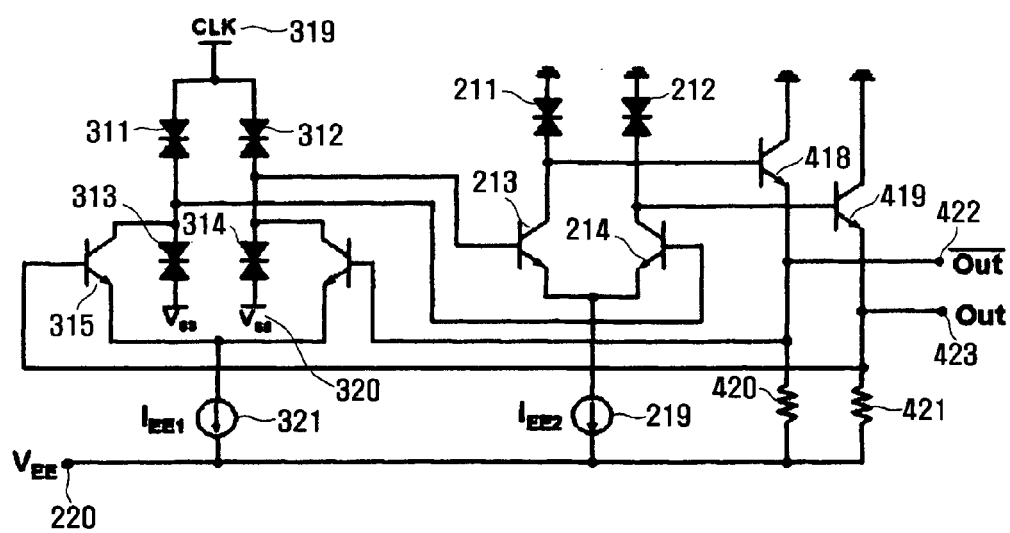
FIG. 25a is a circuit diagram for 2:1 static frequency divider connecting inputs and outputs in feedback, in which emitter followers are connected as output buffers to MOBILE based NRZ mode D-type flip flop circuit with differential inputs and differential outputs, as depicted in FIG. 24, in accordance with the present invention.
Figure 25B:
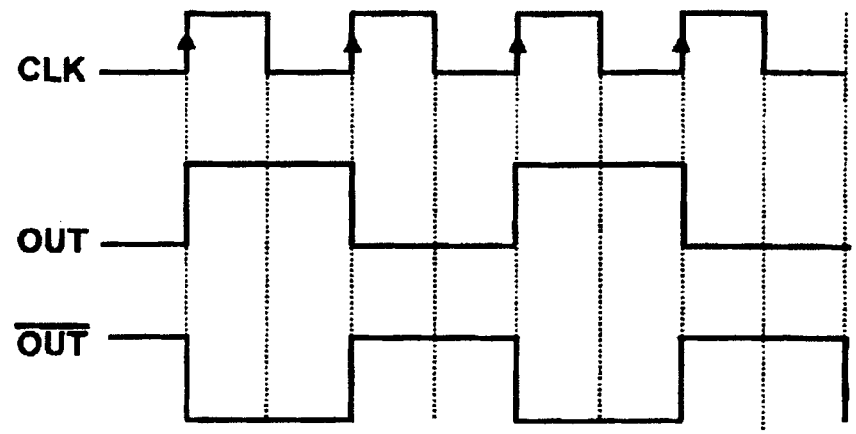

FIG. 25a shows a static frequency divider implemented by feeding the output of D-type flip flop circuit using emitter-follower as an output buffer back to the input. When frequency $f_0$ signal is applied to CLK(319), FIG. 25a produces $f_0/2$ frequency signal. The operation of FIG. 25a is shown in FIG. 25b.

Figure 26:
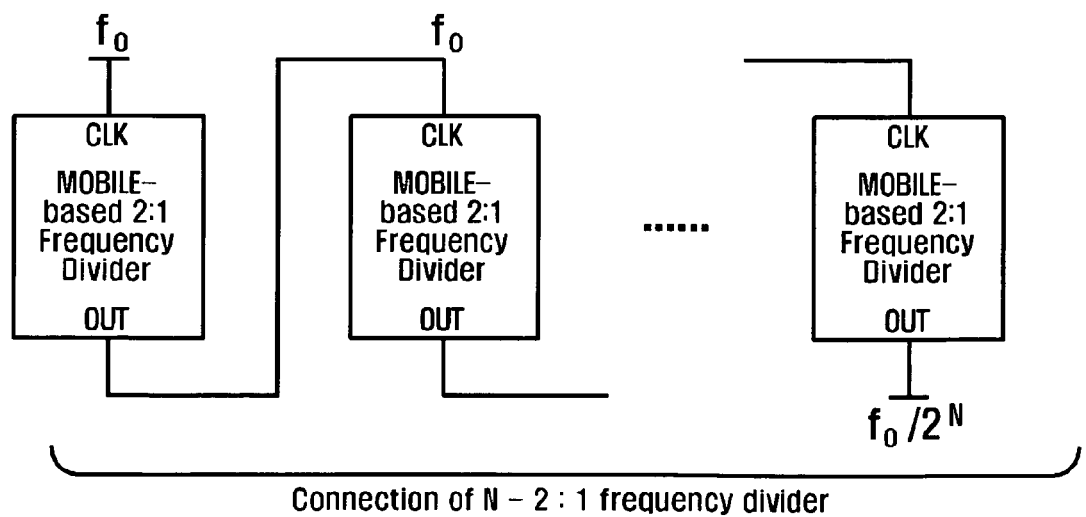
FIG. 26 is a circuit diagram for $2^N$:1 static frequency divider connecting N 2:1 static frequency dividers in cascade, as depicted in FIG. 22.

FIG. 26 shows a $2^N$:1 (N: natural number) static frequency divider connecting N static frequency divider of FIG. 25a in cascade.

Since those having ordinary knowledge and skill in the art of the present invention will recognize additional modifications and applications within the scope thereof, the scope of present invention should not be limited to the embodiments and drawings described above, but should be determined by the Claims.

INDUSTRIAL APPLICABILITY

The present invention relates to SET/RESET latch circuit, Schmitt trigger circuit, and MOBILE based D-type flip flop circuit and frequency divider circuit using the SET/RESET latch circuit and Schmitt trigger circuit. Herein, SET/RESET latch circuit is especially configured with CML-type transistors and negative differential resistance diodes. The SET/ RESET latch circuit can be applied for very high speed digital circuits, as described in the followings.

1) For SET/RESET latch circuit, operating speed is improved by using CML-type transistors, and it also provides differential outputs so that it can be easily used for the conventional high-speed digital circuits with ECL or SCFL interface.

2) A Schmitt trigger circuit with threshold voltages $V_{TH}$ and $V_{TL}$ is simply implemented by replacing SET and RESET of SET/RESET latch circuit with $V_{IN}$ and $V_{REF}$, respectively.

3) Compared to the conventional SCFL or ECL-type D-type flip flop circuit, NRZ mode D-type flip flop circuit in the present invention requires a small number of devices. Since feedback loop is not required, NRZ mode D-type flip flop circuit with highly efficient low-power characteristic as well as very high operating speed can be implemented.

4) A 2:1 static frequency divider circuit can be implemented by feeding the output of NRZ mode D-type flip flop circuit (proposed in the present invention) back to the input port(i.e., feedback output to input).

Since the above circuits implemented in the present invention are used for very high speed digital circuit(more than 40 Gb/s), impedance matching for this very high speed operation should be taken into account. Moreover, there needs an output buffer for achieving compatibility with the circuits configured with ECL and SCFL, in order to be connected in the next stage of D-type flip flop circuit.

The invention claimed is:

1. A MOBILE based D-type flip flop, comprising:

negative differential resistance diodes receiving a common clock signal, and commonly biased negative differential resistance diodes respectively connected to said negative differential resistance diodes receiving the common clock signal, and transistors, wherein each collector of the transistors is respectively connected between one of said negative differential resistance diodes receiving the common clock signal and between one of said commonly biased negative differential resistance diodes, each emitter is connected to a common current source, and each base comprises an input port; and the flip-flop is configured to be operated in a Non-Return-to-Zero mode, in which each collector of said transistors is respectively connected to the base of a transistor for a SET/RESET latch circuit, and an output port is connected to the collector of said SET/RESET latch circuit.

2. A MOBILE based D-type flip flop, as recited in claim 1, wherein the SET/RESET latch circuit comprises:

a plurality of transistors in which each emitter of said transistors is connected to a common current source, and a negative differential resistance diode which is connected to a collector of only one transistor of said transistors; and wherein the latch circuit satisfies the following relationship:

$$I_P < I_{EE} < 2 \cdot I_P$$

where, $I_P$: the peak current of said negative differential resistance diode, $I_{EE}$: the current of the current source connected in series to the common node of emitters of said transistors, wherein a single Non-Return-to-Zero mode output is provided when Return-to-Zero mode SET and RESET voltages are respectively supplied on the base ports of said transistors.

3. A MOBILE based D-type flip flop, as recited in claim 2, wherein a junction diode or a Schottky diode is connected in parallel to said negative differential resistance diode to increase the operating speed and noise margin of the SET/RESET latch circuit.

4. A MOBILE based D-type flip flop, as recited in claim 3, wherein a resistor is connected between each emitter of said transistors to reduce input sensitivity of said SET/RESET latch circuit.

5. A MOBILE based D-type flip flop, as recited in claim 2, further comprising a resistor connected between each emitter of said transistors to reduce input sensitivity of said SET/RESET latch circuit.

6. A MOBILE based D-type flip flop, as recited in claim 1, wherein said SET/RESET latch circuit includes:

a plurality of transistors, each emitter of said transistors being connected to a common current source; and a plurality of negative differential resistance diodes, each being connected to a collector of said transistors, wherein collector terminals of said transistors serve respectively as non-inverted and inverted outputs; and wherein the latch circuit satisfies the following relationship:

$$I_P < I_{EE} < 2 \cdot I_P$$

where, $I_P$: the peak current of said negative differential resistance diodes, $I_{EE}$: the current of the current source, which is connected in series to a common node of emitters of said transistors, wherein a differential Non-Return-to-Zero mode is output when Return-to-Zero mode SET and RESET voltages are respectively supplied on base ports of said transistors.

7. A MOBILE based D-type flip flop, as recited in claim 6, wherein a junction diode or a Schottky diode is connected in parallel to said negative differential resistance diodes of said SET/RESET latch circuit to increase operating speed and noise margin.

8. A MOBILE based D-type flip flop, as recited in claim 6, wherein a resistor is connected between each emitter of said transistors to reduce input sensitivity of said SET/RESET latch circuit.

9. A MOBILE based D-type flip flop, as recited in claim 1, wherein each output port of said SET/RESET latch circuit is respectively connected to a common-emitter buffer or a emitter-follower buffer.

10. A 2:1 frequency divider circuit, comprising the MOBILE D-type flip-flop as recited in claim 9, wherein each output port of said common-emitter buffer or emitter-follower buffer is respectively connected to each base of said transistors.

11. A $2^N$:1 frequency divider circuit, as recited in claim 10, wherein a plurality of said 2:1 frequency dividers are connected in cascade.

* * * * *

UNITED STATES PATENT AND TRADEMARK OFFICE
CERTIFICATE OF CORRECTION

PATENT NO. : 7,573,310 B2  Page 1 of 1
APPLICATION NO. : 11/418207
DATED : August 11, 2009
INVENTOR(S) : K. Yang et al.

It is certified that error appears in the above-identified patent and that said Letters Patent is hereby corrected as shown below:

On the Title page of the printed patent, in line 1 of the Abstract, insert --,-- after "SET/RESET latch circuit".

Signed and Sealed this

Thirteenth Day of September, 2011

David J. Kappos
*Director of the United States Patent and Trademark Office*